United States Patent
Yuan et al.

(10) Patent No.: US 10,520,560 B2
(45) Date of Patent: Dec. 31, 2019

(54) MAGNETIC FIELD SENSING APPARATUS AND DETECTION METHOD THEREOF

(71) Applicants: Fu-Te Yuan, New Taipei (TW); Meng-Huang Lai, New Taipei (TW)

(72) Inventors: Fu-Te Yuan, New Taipei (TW); Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 4 days.

(21) Appl. No.: 15/393,253

(22) Filed: Dec. 29, 2016

(65) Prior Publication Data
US 2017/0184691 A1 Jun. 29, 2017

Related U.S. Application Data

(60) Provisional application No. 62/272,087, filed on Dec. 29, 2015.

(30) Foreign Application Priority Data

Nov. 21, 2016 (TW) .............................. 105138149 A

(51) Int. Cl.
*G01R 33/09* (2006.01)
*G01R 33/06* (2006.01)
*G01R 33/00* (2006.01)

(52) U.S. Cl.
CPC ....... *G01R 33/096* (2013.01); *G01R 33/0023* (2013.01); *G01R 33/06* (2013.01)

(58) Field of Classification Search
CPC ... G01R 33/096; G01R 33/0023; G01R 33/06
See application file for complete search history.

(56) References Cited

U.S. PATENT DOCUMENTS 8,207,732 B2  6/2012  Bartos et al.
8,587,299 B2  11/2013 van Veldhoven et al.
(Continued)

FOREIGN PATENT DOCUMENTS

DE  19839450  3/2000
TW  535000    6/2003
(Continued)

OTHER PUBLICATIONS

"Office Action of Taiwan Counterpart Application," dated Dec. 14, 2017, p. 1-p. 3, in which the listed reference was/references were cited.

*Primary Examiner* — Akm Zakaria
(74) *Attorney, Agent, or Firm* — JCIPRNET

(57) ABSTRACT

A magnetic field sensing apparatus and detection method thereof are provided. The magnetic field sensing apparatus includes an anisotropic magneto-resistive (AMR) magnetic field detector, a reference magnetic field detector, and a controller. The AMR magnetic field detector generates a first output voltage according to a detected magnetic field. The reference magnetic field detector generates a second output voltage according to the detected magnetic field. The controller identifies whether an absolute value of a field density of the detected magnetic field is larger or smaller than a predetermined value or not, and selects the first output voltage or a saturation voltage to be a magnetic field detection result accordingly.

13 Claims, 4 Drawing Sheets

(56) References Cited

U.S. PATENT DOCUMENTS

| | | | | |
|---|---|---|---|---|
| 2003/0057938 A1* | 3/2003 | Goetz | ................... | G01R 33/09 |
| | | | | 324/117 R |
| 2011/0074399 A1 | 3/2011 | Bartos et al. | | |
| 2013/0328556 A1 | 12/2013 | Granig et al. | | |
| 2014/0028308 A1 | 1/2014 | Ogomi et al. | | |
| 2014/0139213 A1* | 5/2014 | Cadugan | ............ | G01R 33/0023 |
| | | | | 324/251 |
| 2015/0008914 A1* | 1/2015 | Hartwig | ................ | A61B 1/041 |
| | | | | 324/252 |
| 2015/0108974 A1* | 4/2015 | Kennedy | ................ | G01R 33/09 |
| | | | | 324/252 |
| 2015/0323612 A1* | 11/2015 | Latham | ................ | G01R 33/096 |
| | | | | 324/251 |

FOREIGN PATENT DOCUMENTS

| | | |
|---|---|---|
| TW | I243254 | 11/2005 |
| TW | I490517 | 7/2015 |

\* cited by examiner

MAGNETIC FIELD SENSING APPARATUS AND DETECTION METHOD THEREOF

CROSS-REFERENCE TO RELATED APPLICATION

This application claims the priority benefits of U.S. provisional application Ser. No. 62/272,087, filed on Dec. 29, 2015, and Taiwan application serial no. 105138149, filed on Nov. 21, 2016. The entirety of each of the above-mentioned patent applications is hereby incorporated by reference herein and made a part of this specification.

BACKGROUND OF THE INVENTION

Field of the Invention

The invention is related to a magnetic field sensing apparatus and a magnetic field detection method, and particularly related to a complex magnetic field sensing apparatus and a magnetic field detection method.

Description of Related Art

Referring to FIG. 1, FIG. 1 illustrates a relation curve diagram of output voltage generated by an anisotropic magneto-resistive (AMR) detector based on the field density of a detected magnetic field. The AMR magnetic field detector may operate in a linear region LR or non-linear region NL1, NL2 according to the measurement of field density of the detected magnetic field. The illustration in FIG. 1 clearly shows that the output voltage generated by the AMR magnetic field detector may correspond to a plurality of field density. Take output voltage V1 as an example, when the AMR magnetic field detector generates output voltage V1, it may not be easy to identify whether the field density of the detected magnetic field is H1 or H2, and thus the accuracy of measurement of magnetic field is reduced.

SUMMARY OF THE INVENTION

The invention provides a magnetic field sensing apparatus and a magnetic field detection method to solve the issue of possible false identification on field density.

In the invention, a magnetic field sensing apparatus includes an anisotropic magneto-resistive (AMR) magnetic field detector, a reference magnetic field detector and a controller. The AMR magnetic field detector generates a first output voltage according to a detected magnetic field. The reference magnetic field detector generates a second output voltage according to the detected magnetic field. The controller is coupled to the AMR magnetic field detector and reference magnetic field detector, and identifies whether an absolute value of the field density of the detected magnetic field is larger or smaller than a predetermined threshold value according to the second output voltage, thereby selecting the first output voltage or a saturation voltage to be the magnetic field detection result accordingly.

In an embodiment of the invention, the AMR magnetic field detector operates in the linear region or non-linear region according to the absolute value of the field density of the detected magnetic field. The predetermined threshold value is set according to a threshold field density value corresponding to the linear region and non-linear region.

In an embodiment of the invention, the predetermined threshold value is obtained by subtracting offset value from the threshold field density value.

In an embodiment of the invention, when the absolute value of the field density of the detected magnetic field is larger than or smaller than predetermined threshold value, the controller selects the first output voltage to be a magnetic field detection result accordingly. When the absolute value of field density of the magnetic field is not larger than or smaller than the predetermined threshold value, the controller selects the saturation voltage to be the magnetic field detection result accordingly.

In an embodiment of the invention, the controller includes a comparator and a selector. The comparator receives a second output voltage and a threshold voltage, and generates a comparison result signal according to comparison of the second output voltage and threshold voltage. The selector is coupled to the comparator, receives the first output voltage and saturation voltage, and selects the second output voltage or saturation voltage to be the magnetic field detection result according to the comparison result signal. The threshold voltage is substantially equivalent to a voltage value of a second voltage generated by the reference magnetic field detector when receiving the detected magnetic field where the absolute value of field density is equal to the predetermined threshold value.

In an embodiment of the invention, when the second output voltage is larger than or smaller than the threshold voltage, the selector selects the saturation voltage to be magnetic field detection result according to the comparison result signal.

In an embodiment of the invention, when the second output voltage is not larger than or smaller than the threshold voltage, the selector selects the first output voltage to be magnetic field detection result according to the comparison result signal.

In an embodiment of the invention, the controller includes a comparator and a selector. The comparator receives the second output voltage, first threshold voltage and second threshold voltage, and generates the comparison result signal according to comparisons between the second output voltage and first threshold voltage as well as second threshold voltage. The selector is coupled to the comparator, receives the second output voltage and saturation voltage, and selects the second output voltage or saturation voltage to be the magnetic field detection result according to the comparison result signal. The first threshold voltage is substantially equivalent to a voltage value of a second voltage generated by the reference magnetic field detector when receiving the detected magnetic field where the field density is equal to the predetermined threshold value. The second threshold voltage is substantially equivalent to a voltage value of a second voltage generated by the reference magnetic field detector when receiving the detected magnetic field where the field density is equal to a negative predetermined threshold value. The predetermined threshold value is an additive inverse of the negative predetermined threshold value.

In an embodiment of the invention, when the second output voltage is between the first threshold voltage and second threshold voltage, the selector selects the first output voltage to be the magnetic field detection result according to the comparison result signal, wherein when the second output voltage is larger than the first threshold voltage or smaller than the second threshold voltage, the selector selects the saturation voltage to be the magnetic field detection result according to the comparison result signal.

In an embodiment of the invention, the reference magnetic field detector is a second AMR detector, a giant magneto-resistance (GMR) sensor, a tunneling magneto-resistance (TMR) sensor, a magneto-resistance detection sensor or Hall sensor.

The magnetic field detection method includes providing an AMR magnetic field detector to generate a first output voltage according to a detected magnetic field; providing a reference magnetic field detector to generate a second output voltage according to a detected magnetic field; and identifying whether an absolute value of field density of the detected magnetic field is larger than or smaller than a predetermined threshold value, thereby selecting the first output voltage or saturation voltage to be the magnetic field detection result accordingly.

Based on the above, the invention identifies whether the detected magnetic field makes the AMR magnetic field detector to operate in the linear region according to the second output voltage generated by the reference magnetic field detector. Moreover, when the AMR magnetic field detector operates in the linear region, the first output voltage generated by the AMR magnetic field detector is set to be the magnetic field detection result. When the AMR magnetic field detector operates in the non-linear region, the saturation voltage is set to be the magnetic field detection result. Accordingly, the field density may not be misidentified based on the magnetic field detection result generated by the magnetic field sensing apparatus, thereby improving the accuracy of the magnetic field detection result.

In order to make the aforementioned features and advantages of the invention more comprehensible, embodiments accompanying figures are described in detail below.

DESCRIPTION OF EMBODIMENTS

Figure 1:
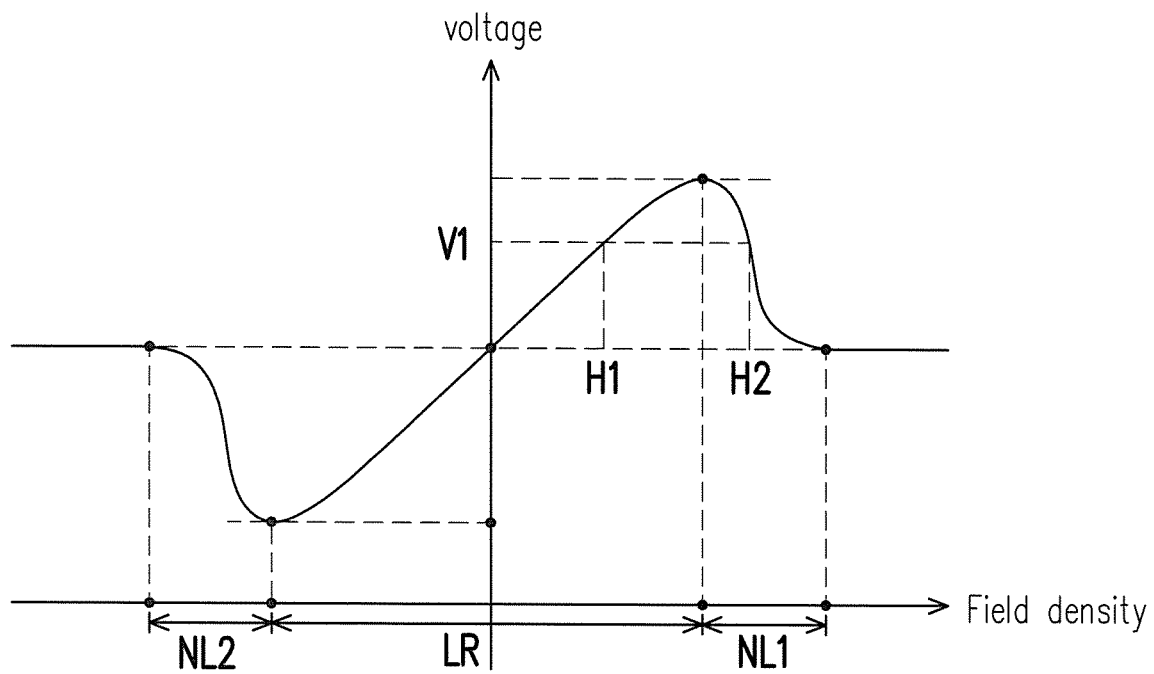
FIG. 1 illustrates a relation curve diagram of an output voltage generated by an anisotropic magneto-resistive (AMR) magnetic field detector according to a field density of a detected magnetic field.
Figure 2:
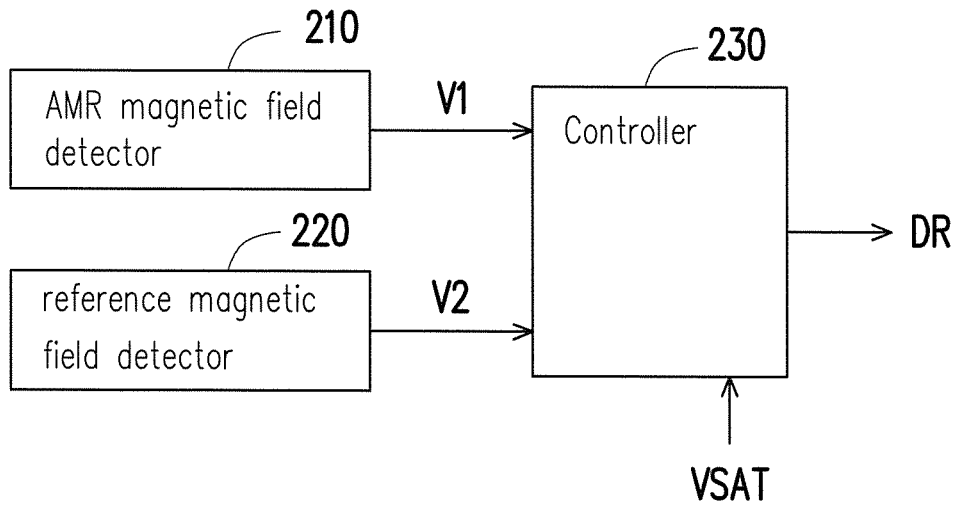
FIG. 2 is a schematic view illustrating a magnetic field sensing apparatus according to an embodiment of the invention.

Referring to FIG. 2, FIG. 2 is a schematic view illustrating a magnetic field sensing apparatus according to an embodiment of the invention. A magnetic field sensing apparatus 200 includes an anisotropic magneto-resistive (AMR) magnetic field detector 210, a reference magnetic field detector 220 and a controller 230. The AMR magnetic field detector 210 generates an output voltage V1 according to a detected magnetic field. The reference magnetic field detector 220 generates an output voltage V2 according to the detected magnetic field. In addition, the controller 230 is coupled to the AMR magnetic field detector 210 and reference magnetic field detector 220 to respectively receive the output voltage V1 and V2. On the other hand, the controller 230 receives the saturation voltage VSAT. The controller 230 identifies whether an absolute value of a field density of the detected magnetic field is larger than a predetermined threshold value according to the output voltage V2. In addition, the controller 230 selects the output voltage V1 or saturation voltage VSAT to be the magnetic field detection result DR based on whether the absolute value of the field density of the detected magnetic field is larger than the predetermined threshold value.

Specifically, when the controller 230 identifies that the absolute value of the field density of detected magnetic field is larger than the predetermined threshold value according to the output voltage V2, the controller 230 selects the saturation voltage VSAT to be the magnetic field detection result DR. Relatively, when the controller 230 identifies that the absolute value of the field density of detected magnetic field is not larger than the predetermined threshold value according to the output voltage V2, the controller 230 selects the output voltage V1 to be the magnetic field detection result DR.

Figure 3:
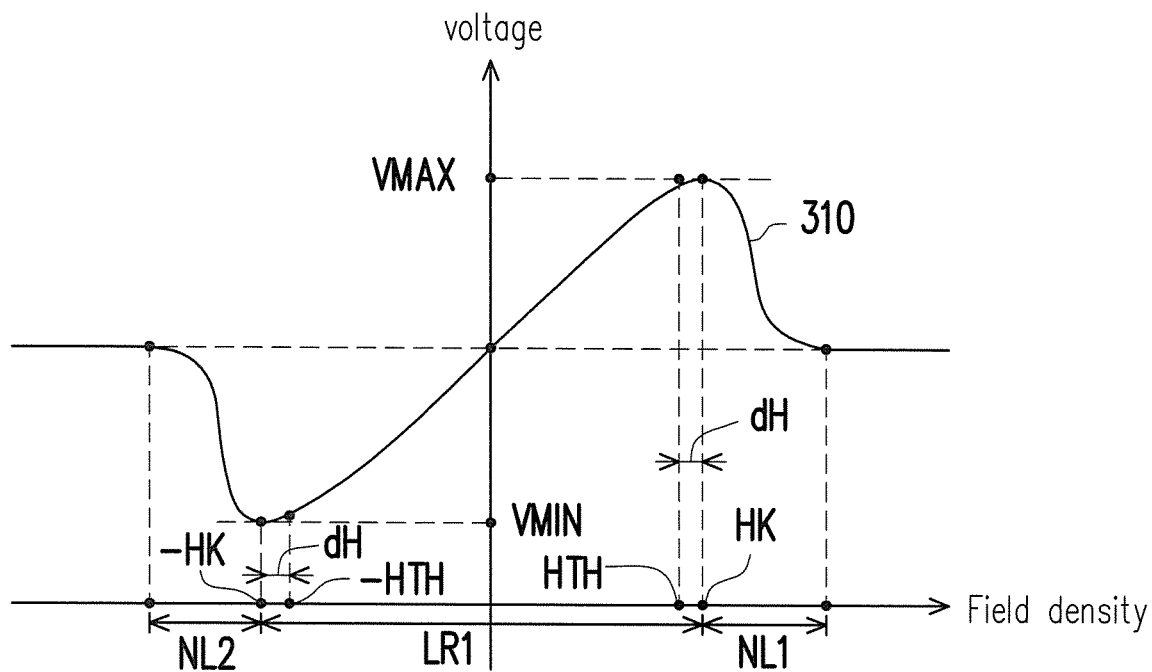
FIG. 3 is a schematic view illustrating a method of setting a predetermined threshold value.

Regarding the method of setting the predetermined threshold value, please refer to FIG. 3, which is a schematic view illustrating a method of setting a predetermined threshold value. In FIG. 3, a characteristic curve 310 is a relation curve showing the relation between the output voltage V1 generated by the AMR magnetic field detector 210 and the field density of the detected magnetic field. The AMR magnetic field detector 210 may operate in a linear region LR1, non-linear region NL1 or NL2 according to a field density of the detected magnetic field. Each of boundaries between the linear region LR1 and non-linear region NL1 or NL2 occurs at a threshold field density values HK and −HK. The threshold field density values HK and −HK respectively correspond to a maximum output voltage VMAX and a minimum output voltage VMIN. The predetermined threshold value may be set according to the threshold field density values HK and −HK.

In an embodiment of the invention, the predetermined threshold value may be set according to the absolute value of the threshold field density value HK. Specifically, the predetermined threshold value may be obtained by subtracting an offset value dH from the absolute value of the threshold field density value HK. In FIG. 3, the predetermined threshold value may be obtained by the equation of HK−dH, wherein the threshold field density value HK is larger than 0 and the offset value dH is also larger than 0. In other words, when the field density of the detected magnetic field is between the field density HTH and −HTH, it means that the absolute value of field density of detected magnetic field is not larger than the predetermined threshold value. When the field density of the detected magnetic field is larger than the field density HTH or smaller than the field density −HTH, it means that the absolute value of the field density of the detected magnetic field is larger than the predetermined threshold value.

Figure 4:
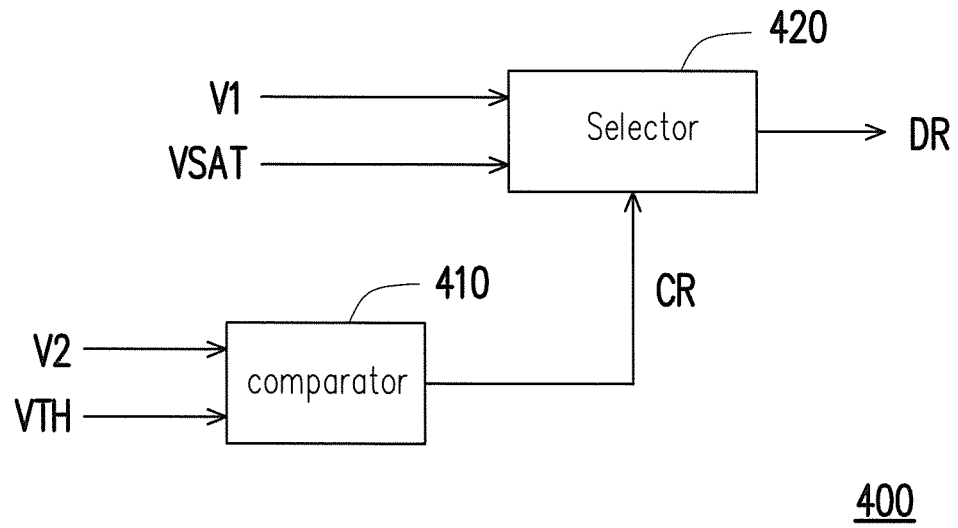
FIG. 4 is a schematic view illustrating an implementation method of a controller according to an embodiment of the invention.

Referring to FIG. 4, FIG. 4 is a schematic view illustrating an implementation method of a controller according to an embodiment of the invention. A controller 400 includes a comparator 410 and a selector 420. The comparator 410 receives a threshold voltage VTH and an output voltage V2 generated by the reference magnetic field detector, and compares the threshold voltage VTH and output voltage V2 to generate the comparison result signal CR. The selector 420 is coupled to the comparator 410, receives the output voltage V1 generated by the AMR magnetic field detector, saturation voltage VSAT and comparison result signal CR. The selector 420 selects the output voltage V1 or saturation voltage VSAT to be the magnetic field detection result DR according to the comparison result signal CR.

Figure 5:
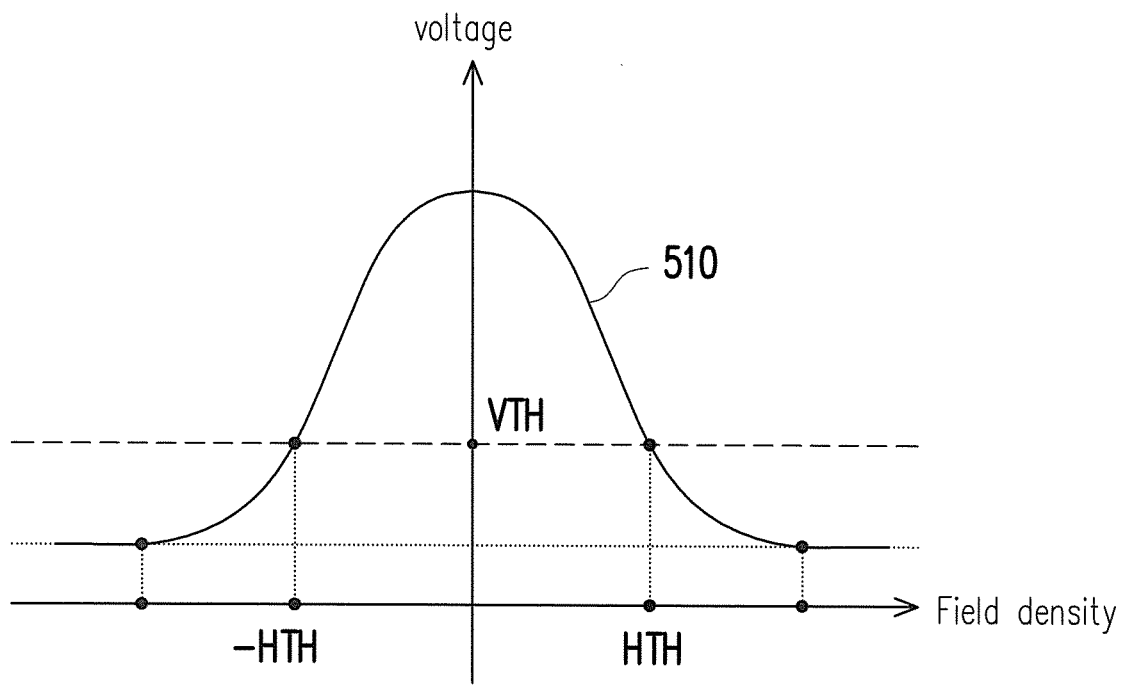
FIG. 5 illustrates a characteristic curve diagram of a reference magnetic field detector according to an embodiment of the invention.

Regarding the method of setting the threshold voltage VTH, please refer to FIGS. 4 and 5. FIG. 5 illustrates a characteristic curve diagram of a reference magnetic field detector according to an embodiment of the invention. In FIG. 5, a characteristic curve 510 is symmetrical to a voltage coordinate axis of output voltage in the longitudinal axis. Corresponding to the field density HTH and −HTH for setting the predetermined threshold value in FIG. 3, in the characteristic curve diagram 510, the output voltage corresponding to the field density HTH and −HTH may be set to be the threshold voltage VTH. Accordingly, the comparator 410 may identify whether the absolute value of the field density of the detected magnetic field is larger than the predetermined threshold value by comparing the output voltage V2 generated by the reference magnetic field detector and the threshold voltage VTH. In other words, in the embodiment, when the output voltage V2 generated by the reference magnetic field detector is not larger than the threshold voltage VTH, it means that the absolute value of the field density of the detected magnetic field is larger than the predetermined threshold value. At this time, the selector 420 selects the saturation voltage VSAT to be the magnetic field detection result DR according to the received comparison result signal CR. Relatively, when the output voltage V2 generated by the reference magnetic field detector is larger than the threshold voltage VTH, it means that the absolute value of the field density of the detected magnetic field is smaller than the predetermined threshold value. At this time, the selector 420 selects the output voltage V1 generated by the AMR magnetic field detector to be the magnetic field detection result DR according to the received comparison result signal CR. The voltage value of the saturation voltage VSAT may be set to be substantially equivalent to a maximum value of the output voltage possibly generated by the AMR magnetic field detector.

Additionally, the comparator 410 and selector 420 may be constructed respectively by using a comparing circuit and selector circuit known to persons of ordinary skill in the art; the invention provides no limitation thereto.

In some embodiments, there is a negative peak value when the characteristic curve diagram of the reference magnetic field detector is likely to be in symmetry with the illustration in FIG. 5 in the horizontal axis. In this condition, when the output voltage V2 generated by the reference magnetic field detector is not smaller than the threshold voltage VTH, it means that the absolute value of the field density of the detected magnetic field is larger than the predetermined threshold value. At this time, the selector 420 selects the saturation voltage VSAT to be the magnetic field detection result DR according to the received comparison result signal CR. Relatively, when the output voltage V2 generated by the reference magnetic field detector is smaller than the threshold voltage VTH, it means that the absolute value of field density of the detected magnetic field is smaller than the predetermined threshold value. At this time, the selector 420 selects the output voltage V1 generated by the AMR magnetic field detector to be the magnetic field detection result DR according to the received comparison result signal CR.

Figure 6:
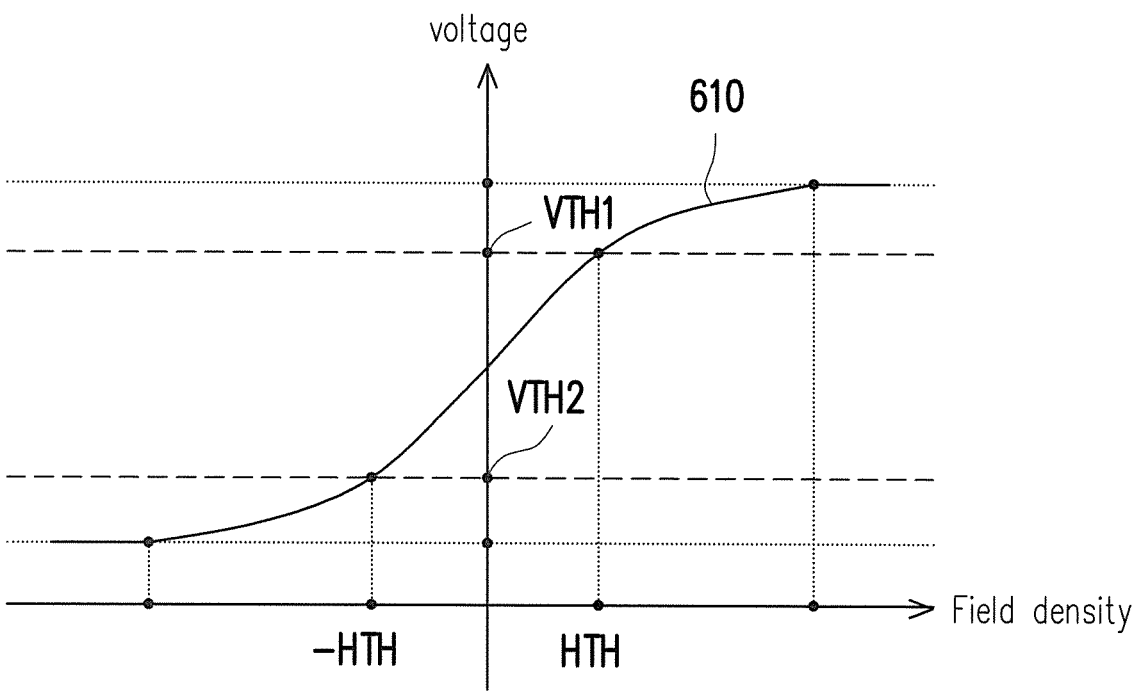
FIG. 6 is a characteristic curve diagram of a reference magnetic field detector according to another embodiment of the invention.

Referring to FIG. 6, FIG. 6 is a characteristic curve diagram of a reference magnetic field detector according to another embodiment of the invention. It should be noted that the invention provides no limitation to the characteristic curve of the reference magnetic field detector as shown in FIG. 5. The reference magnetic field detector having a characteristic curve 610 as shown in FIG. 6 may be applicable to the invention. Corresponding to the field density HTH and −HTH for setting the predetermined threshold value in FIG. 3, in the characteristic curve diagram 610, the output voltage corresponding to the field density HTH and −HTH respectively may be set to be a first threshold voltage VTH1 and a second threshold voltage VTH2. It can be identified whether the absolute value of the field density of detected magnetic field is larger than the predetermined threshold value based on determining whether the output voltage V2 generated by the reference magnetic field detector is between the first threshold voltage VTH1 and second threshold voltage VTH2. Specifically, when the output voltage V2 generated by the reference magnetic field detector is between the first threshold voltage VTH1 and second threshold voltage VTH2, the absolute value of field density of the detected magnetic field is not larger than the predetermined threshold value. Relatively, when the output voltage V2 generated by the reference magnetic field detector is larger than the first threshold voltage VTH1 or smaller than the second threshold voltage VTH2, the absolute value of the field density of the detected magnetic field is larger than the predetermined threshold value.

Figure 7:
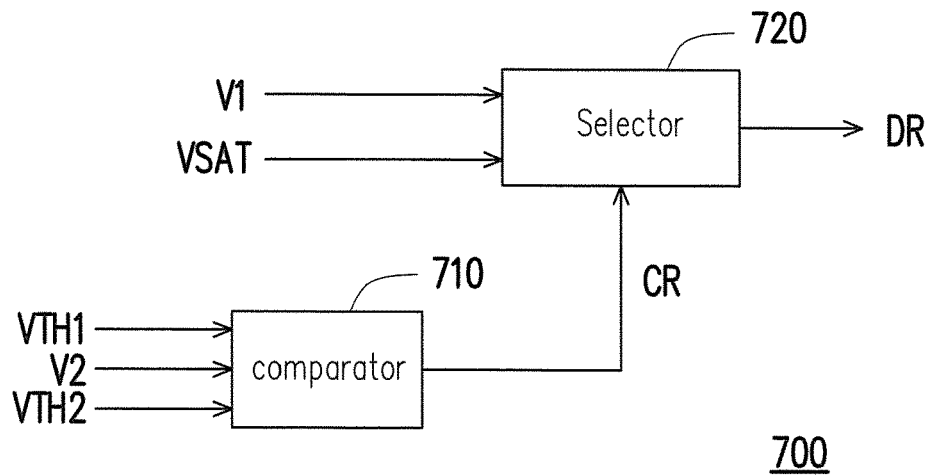
FIG. 7 is a schematic view illustrating an implementation method of a controller according to another embodiment of the invention.

Referring to FIG. 7, FIG. 7 is a schematic view illustrating an implementation method of a controller according to another embodiment of the invention. A controller 700 corresponds to the characteristic curve 610 illustrated in FIG. 6. The controller 700 includes a comparator 710 and a selector 720. The comparator 710 receives the first threshold voltage VTH1, second threshold voltage VTH2 and the output voltage V2 generated by the reference magnetic field detector, and generates the comparison result signal CR according to comparisons between the output voltage V2 and the first threshold voltage VTH1 as well as the second threshold voltage VTH2. The selector 720 may select the output voltage V1 generated by the AMR magnetic field detector or saturation voltage VSAT to be the magnetic field detection result DR according to the comparison result signal CR.

Specifically, the comparator 710 may include two comparing circuits. One of the comparing circuits compares the output voltage V2 and first threshold voltage VTH1; the other comparing circuit compares the output voltage V2 and the second threshold voltage VTH2. The comparator 710 calculates (e.g. logic calculation) the comparison result generated by the two comparing circuits to generate the comparison result signal CR. When the output voltage V2 is between the first threshold voltage VTH1 and the second threshold voltage VTH2, the selector 720 may select the first output voltage V1 to be the magnetic field detection result DR according to the comparison result signal CR. Relatively, when the output voltage V2 is not between the first threshold voltage VTH1 and the second threshold voltage VTH2 (larger than the first threshold voltage VTH1 or smaller than the second threshold voltage VTH2), the selector 720 may select the saturation voltage VSAT to be the magnetic field detection result DR according to the comparison result signal CR.

The comparator 710 and selector 720 may be constructed respectively by using the comparing circuit and selector circuit known to persons of ordinary skill in the art; the invention provides no limitation thereto.

The embodiments illustrated in FIGS. 4 to 7 show that the invention provides no limitation to the form of the reference magnetic field detector in the magnetic field sensing apparatus. In the embodiment of the invention, the reference magnetic field detector may be another AMR detector, a GMR sensor, a TMR sensor, a MI sensor or a Hall sensor.

Figure 8:
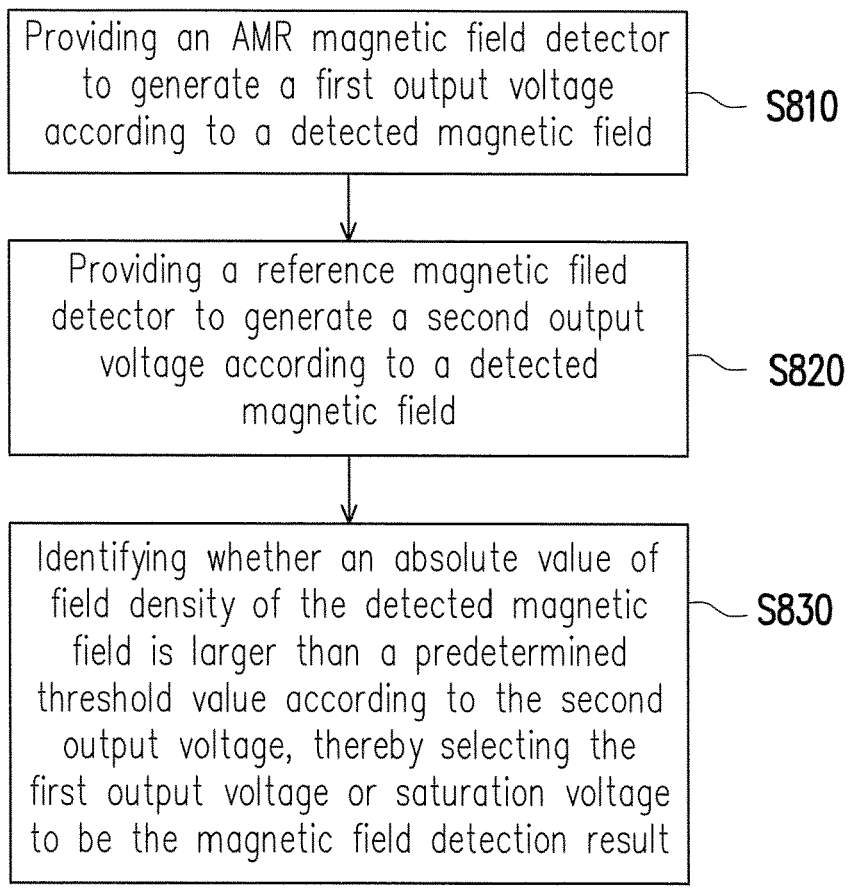
FIG. 8 is a flowchart illustrating a magnetic field detection method according to an embodiment of the invention.

Referring to FIG. 8, FIG. 8 is a flowchart illustrating a magnetic field detection method according to an embodiment of the invention. Step S810 provides the AMR magnetic field detector to generate the first output voltage according to the detected magnetic field. Subsequently, step S820 provides the reference magnetic field detector to generate the second output voltage according to the detected magnetic field. Next, step S830 identifies whether the absolute value of the field density of the detected magnetic field is larger than the predetermined threshold value according to the second output voltage, thereby selecting the first output voltage or saturation voltage to be the magnetic field detection result accordingly.

The implementation method in the steps above, namely the details of implementation, are described comprehensively in the embodiments and methods provided above. Therefore, no repetition is incorporated herein.

In summary, in the invention, the magnetic field sensing apparatus uses a complex magnetic field sensing structure to measure field density of detected field via the reference magnetic field detector, and selects to output the output voltage generated by the AMR magnetic field detector or saturation voltage having fixed voltage value according to the measurement of field density. Accordingly, the determination made by using the magnetic field detection result of the magnetic field sensing apparatus may not be misidentified, thereby improving the accuracy of the magnetic field detection result.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A magnetic field sensing apparatus, comprising:
    an anisotropic magneto-resistance (AMR) magnetic field detector, generating a first output voltage according to a detected magnetic field;
    a reference magnetic field detector, generating a second output voltage according to the detected magnetic field; and
    a controller, coupled to the AMR magnetic field detector and the reference magnetic field detector, identifying whether an absolute value of a field density of the detected magnetic field is larger than or smaller than a predetermined threshold value according to the second output voltage to select the first output voltage or a saturation voltage to be a magnetic field detection result,
    wherein the controller comprises:
    a comparator, receiving the second output voltage and a threshold voltage, and generating a comparison result signal according to comparison of the second output voltage and the threshold voltage; and
    a selector, coupled to the comparator, receiving the first output voltage and the saturation voltage, and selecting the first output voltage or the saturation voltage to be the magnetic field detection result according to the comparison result signal,
    wherein the threshold voltage is equal to a voltage value of the second voltage generated by the reference magnetic field detector when receiving the detected magnetic field where the absolute value of the field density is equal to the predetermined threshold value,
    wherein the AMR magnetic field detector operates in a linear region or a non-linear region according to the absolute value of the field density of the detected magnetic field, the predetermined threshold value is set according to a threshold field density corresponding to the linear region and the non-linear region,
    wherein a boundary between the linear region and the non-linear region occurs at the threshold field density,
    wherein when the absolute value of the field density of the detected magnetic field is not larger than or smaller than the predetermined threshold value, the controller selects the saturation voltage to be the magnetic field detection result.

2. The magnetic field sensing apparatus according to claim 1, wherein the predetermined threshold value is obtained by subtracting an offset value from the threshold field density.

3. The magnetic field sensing apparatus according to claim 1, wherein when the absolute value of the field density of the detected magnetic field is larger than or smaller than the predetermined threshold value, the controller selects the first output voltage to be the magnetic field detection result.

4. The magnetic field sensing apparatus according to claim 1, wherein when the second output voltage is not larger than or smaller than the threshold voltage, the selector selects the saturation voltage to be the magnetic field detection result according to the comparison result signal.

5. The magnetic field sensing apparatus according to claim 1, wherein when the second output voltage is larger than or smaller than the threshold voltage, the selector selects the first output voltage to be the magnetic field detection result according to the comparison result signal.

6. The magnetic field sensing apparatus according to claim 1, wherein the reference magnetic field detector is a second AMR detector, a giant magneto-resistance (GMR) sensor, a tunneling magneto-resistance (TMR) sensor, a magneto-resistance detection sensor or Hall sensor.

7. A magnetic field detection method, comprising:
    providing an AMR magnetic field detector to generate a first output voltage according to a detected magnetic field;
    providing a reference magnetic field detector to generate a second output voltage according to the detected magnetic field; and
    identifying whether an absolute value of a field density of the detected magnetic field is larger than or smaller than a predetermined threshold value according to the second output voltage to select the first output voltage or a saturation voltage to be a magnetic field detection result,
    wherein the step of identifying whether the absolute value of the field density of the detected magnetic field is larger than or smaller than the predetermined threshold value according to the second output voltage, thereby selecting the first output voltage or the saturation voltage to be the magnetic field detection result accordingly comprises:
    providing a comparator to compare the second output voltage and a threshold voltage or compare the second output voltage and a first threshold voltage as well as a second threshold voltage to generate a comparison result signal;
    providing a selector to select the first output voltage or the saturation voltage to be the magnetic field detection result according to the comparison result signal; and when the absolute value of the field density of the detected magnetic field is not larger than or smaller than the predetermined threshold value, selecting the saturation voltage to be the magnetic field detection result, wherein the threshold voltage is equal to a voltage value of the second voltage generated by the reference magnetic field detector when receiving the detected magnetic field where the absolute value of the field density is equal to the predetermined threshold value, wherein the first threshold voltage is equal to the voltage value of the second voltage generated by the reference magnetic field detector when receiving the detected magnetic field where the field density is equal to the predetermined threshold value, the second threshold voltage is equal to the voltage value of the second voltage generated by the reference magnetic field detector when receiving the detected magnetic field where the field density is equal to a negative predetermined threshold value, the predetermined threshold value is an additive inverse of the negative predetermined threshold value, wherein the AMR magnetic field detector operates in a linear region or a non-linear region according to the absolute value of the field density of the detected magnetic field, the magnetic field detection method further comprising:

setting the predetermined threshold value according to a threshold field density corresponding to the linear region and the non-linear region, wherein a boundary between the linear region and the non-linear region occurs at the threshold field density.

8. The magnetic field detection method according to claim 7, wherein the step of setting the predetermined threshold value according to the threshold field density corresponding to the linear region and the non-linear region comprises:
obtaining the predetermined threshold value by subtracting an offset value from the threshold field density.

9. The magnetic field detection method according to claim 7, wherein the step of identifying whether the absolute value of the field density of the detected magnetic field is larger than or smaller than the predetermined threshold value according to the second output voltage, thereby selecting the first output voltage or the saturation voltage to be the magnetic field detection result accordingly comprises:
when the absolute value of the field density of the detected magnetic field is larger than or smaller than the predetermined threshold value, selecting the first output voltage to be the magnetic field detection result.

10. The magnetic field detection method according to claim 7, wherein providing the comparator to compare the second output voltage and the threshold voltage to generate the comparison result signal, the step of selecting the first output voltage or the saturation voltage to be the magnetic field detection result according to the comparison result signal comprises:
when the second output voltage is larger than or smaller than the threshold voltage, selecting the first output voltage to be the magnetic field detection result according to the comparison result signal; and
when the second output voltage is not larger than or smaller than the threshold voltage, selecting the saturation voltage to be the magnetic field detection result according to the comparison result signal.

11. The magnetic field detection method according to claim 7, wherein providing the comparator to compare the second output voltage and the first threshold voltage as well as the second threshold voltage to generate the comparison result signal, the step of selecting the first output voltage or the saturation voltage to be the magnetic field detection result according to the comparison result signal comprises:
when the second output voltage is between the first threshold voltage and the second threshold voltage, selecting the first output voltage to be the magnetic field detection result according to the comparison result signal; and
when the second output voltage is larger than the first threshold voltage or smaller than the second threshold voltage, the selector selects the saturation voltage to be the magnetic field detection result according to the comparison result signal.

12. A magnetic field sensing apparatus, comprising:
an anisotropic magneto-resistance (AMR) magnetic field detector, generating a first output voltage according to a detected magnetic field;
a reference magnetic field detector, generating a second output voltage according to the detected magnetic field; and
a controller, coupled to the AMR magnetic field detector and the reference magnetic field detector, identifying whether an absolute value of a field density of the detected magnetic field is larger than or smaller than a predetermined threshold value according to the second output voltage to select the first output voltage or a saturation voltage to be a magnetic field detection result,
wherein the controller comprises:
a comparator, receiving the second output voltage, a first threshold voltage and a second threshold voltage, comparing the second output voltage and the first threshold voltage as well as the second threshold voltage to generate a comparison result signal; and
a selector, coupled to the selector, receiving the first output voltage and the saturation voltage, selecting the first output voltage or the saturation voltage to be the magnetic field detection result according to the comparison result signal,
wherein the first threshold voltage is equal to a voltage value of the second voltage generated by the reference magnetic field detector when receiving the detected magnetic field where the field density is equal to the predetermined threshold value, the second threshold voltage is equal to the voltage value of the second voltage generated by the reference magnetic field detector when receiving the detected magnetic field where the field density is equal to a negative predetermined threshold value, the predetermined threshold value is an additive inverse of the negative predetermined threshold value,
wherein the AMR magnetic field detector operates in a linear region or a non-linear region according to the absolute value of the field density of the detected magnetic field, the predetermined threshold value is set according to a threshold field density corresponding to the linear region and the non-linear region,
wherein a boundary between the linear region and the non-linear region occurs at the threshold field density,
wherein when the second output voltage is larger than the first threshold voltage or smaller than the second threshold voltage, the selector selects the saturation voltage to be the magnetic field detection result according to the comparison result signal.

13. The magnetic field sensing apparatus according to claim 12, wherein when the second output voltage is between the first threshold voltage and the second threshold voltage, the selector selects the first output voltage to be the magnetic field detection result according to the comparison result signal.

* * * * *